(12) United States Patent
Kikai et al.

(10) Patent No.: US 11,469,115 B2
(45) Date of Patent: Oct. 11, 2022

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventors: Takaya Kikai, Koshi (JP); Yuzo Ohishi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/097,091

(22) Filed: Nov. 13, 2020

(65) Prior Publication Data

US 2021/0066098 A1    Mar. 4, 2021

Related U.S. Application Data

(63) Continuation of application No. 16/186,805, filed on Nov. 12, 2018, now Pat. No. 10,867,813.

(30) Foreign Application Priority Data

Nov. 13, 2017  (JP) .............................. JP2017-218545

(51) Int. Cl.

| | |
|---|---|
| *H01L 21/67* | (2006.01) |
| *B08B 7/00* | (2006.01) |
| *H01L 21/02* | (2006.01) |
| *H01L 21/687* | (2006.01) |
| *H01L 21/311* | (2006.01) |

(52) U.S. Cl.
CPC ...... *H01L 21/67028* (2013.01); *B08B 7/0057* (2013.01); *H01L 21/02057* (2013.01); *H01L 21/31138* (2013.01); *H01L 21/67103* (2013.01); *H01L 21/67115* (2013.01); *H01L 21/67248* (2013.01); *H01L 21/67253* (2013.01); *H01L 21/68742* (2013.01); *H01L 21/68764* (2013.01)

(58) Field of Classification Search
None
See application file for complete search history.

(56) References Cited

U.S. PATENT DOCUMENTS

2017/0047233 A1   2/2017  Kaneda et al.

FOREIGN PATENT DOCUMENTS

| JP | S61-224320 A | 10/1986 |
|---|---|---|
| JP | S63-079323 A | 4/1988 |
| JP | H03-067337 U | 7/1991 |
| JP | H04-230017 A | 8/1992 |
| JP | 2009-170554 A | 7/2009 |
| JP | 2016-027617 A | 2/2016 |
| JP | 2016-119357 A | 6/2016 |

*Primary Examiner* — Eric W Golightly
(74) *Attorney, Agent, or Firm* — Pearne & Gordon LLP

(57) ABSTRACT

A substrate processing apparatus 1 includes a rotating/holding unit 30 configured to hold and rotate a wafer W having an organic film on a front surface Wa thereof; a light irradiating unit 40 configured to irradiate light for aching of the organic film to the front surface; a gas flow forming unit 50 configured to form a gas flow of an oxygen-containing gas which passes between the wafer W and the light irradiating unit 40; an irradiation control unit 114 configured to irradiate the light to the front surface in a state that the gas flow is formed between the wafer W and the light irradiating unit 40; and a rotation control unit 115 configured to rotate the wafer W in a state that the gas flow is formed between the wafer W and the light irradiating unit 40 and the light is irradiated to the front surface.

3 Claims, 15 Drawing Sheets

SUBSTRATE PROCESSING APPARATUS, SUBSTRATE PROCESSING METHOD AND RECORDING MEDIUM

CROSS-REFERENCE TO RELATED APPLICATION

This is a continuation application of U.S. patent application Ser. No. 16/186,805, filed on Nov. 12, 2018 and issued as U.S. Pat. No. 10,867,813 on Dec. 15, 2020, which claims the benefit of Japanese Patent Application No. 2017-218545 filed on Nov. 13, 2017, the entire disclosures of which are incorporated herein by reference.

TECHNICAL FIELD

The various aspects and embodiments described herein pertain generally to a substrate processing apparatus, a substrate processing method and a recording medium.

BACKGROUND

Patent Document 1 discloses a substrate processing method in which: a substrate having a processing target film formed thereon is placed within a processing chamber in an oxygen-containing atmosphere with a gas having a flow velocity equal to or less than 10 cm/s; and a part of the processing target film is removed by irradiating an ultraviolet ray to the substrate.

Patent Document 1: Japanese Patent Laid-open Publication No. 2016-027617

SUMMARY

Exemplary embodiments provide a substrate processing apparatus and a substrate processing method capable of light irradiating processing upon an organic film formed on a front surface of a substrate.

A substrate processing apparatus includes a rotating/holding unit configured to hold and rotate a substrate having an organic film on a front surface thereof; a light irradiating unit configured to irradiate light for ashing of the organic film to the front surface of the substrate held by the rotating/holding unit; a gas flow forming unit configured to form a gas flow of an oxygen-containing gas to allow the oxygen-containing gas to pass through a space between the substrate held by the rotating/holding unit and the light irradiating unit; an irradiation control unit configured to control the light irradiating unit to irradiate the light for ashing to the front surface of the substrate in a state that the gas flow of the oxygen-containing gas is formed between the substrate and the light irradiating unit by the gas flow forming unit; and a rotation control unit configured to control the rotating/holding unit to rotate the substrate in a state that the gas flow of the oxygen-containing gas is formed between the substrate and the light irradiating unit by the gas flow forming unit and the light for ashing is irradiated to the front surface of the substrate by the light irradiating unit.

According to this substrate processing apparatus, the light for ashing is irradiated to the front surface of the substrate in the state that the gas flow of the oxygen-containing gas is formed between the substrate and the light irradiating unit by the gas flow forming unit. Therefore, since the oxygen is continuously supplied into the space between the substrate and the light irradiating unit while the light for ashing is being irradiated, the ashing can be easily performed to a required level. Further, the substrate is rotated in the state that the gas flow of the oxygen-containing gas is formed between the substrate and the light irradiating unit by the gas flow forming unit and the light for ashing is irradiated to the front surface of the substrate by the light irradiating unit. Accordingly, the non-uniformity in the ashing that might be caused by the gas flow can be suppressed. Thus, the uniformity of the ashing can be improved.

The substrate processing apparatus may further include a heat plate provided in the rotating/holding unit to face a rear surface of the substrate and configured to be rotated along with the substrate; and a heating control unit configured to control the heat plate to adjust a temperature distribution under a condition that a difference in progression of the ashing in regions arranged in a diametrical direction of the substrate is reduced. If there is adopted the configuration in which the substrate is rotated in the state that the gas flow of the oxygen-containing gas is formed between the substrate and the light irradiating unit by the gas flow forming unit and the light for ashing is irradiated to the front surface of the substrate by the light irradiating unit, the uniformity of the ashing in the circumferential direction of the substrate can be improved. In addition, by adopting the configuration in which the temperature distribution is adjusted in each of the regions arranged in the diametrical direction of the substrate, the uniformity of the ashing in the diametrical direction of the substrate can also be improved.

The irradiation control unit may control the light irradiating unit to adjust an irradiation amount of the light for ashing under a condition that a difference in progression of the ashing in regions arranged in a diametrical direction of the substrate is reduced. In this case, by adopting the configuration in which the irradiation amount of the light for ashing is adjusted for each of the regions arranged in the diametrical direction of the substrate, the uniformity of the ashing in the diametrical direction of the substrate can be improved.

The substrate processing apparatus may further include a distance changing unit configured to change a distance between the substrate held by the rotating/holding unit and the light irradiating unit; and a distance change control unit configured to control the distance changing unit to change the distance between the substrate and the light irradiating unit such that, in the state that the gas flow of the oxygen-containing gas is formed between the substrate and the light irradiating unit, the light for ashing is irradiated under multiple conditions where the distances between the substrate and the light irradiating unit are set to be different. In this case, by changing the distance between the substrate and the light irradiating unit, a distribution of an oxygen concentration can be changed in a gas flow direction, so that the uniformity of the ashing in the gas flow direction can be improved.

The substrate processing apparatus may further include an oxygen adding unit configured to add oxygen to the oxygen-containing gas; and an addition control unit configured to control the oxygen adding unit to add the oxygen to the oxygen-containing gas before being introduced into the space between the substrate and the light irradiating unit in the state that the gas flow of the oxygen-containing gas is formed between the substrate and the light irradiating unit by the gas flow forming unit and the light is irradiated to the front surface of the substrate by the light irradiating unit. In this case, by adding the oxygen, lack of the oxygen at the downstream side of the gas flow can be suppressed, so that the uniformity of the ashing in the gas flow direction can be improved. Therefore, in a case that the progression of the ashing at the central portion of the substrate becomes slower than the progression of the ashing at the edge portion thereof, the difference therebetween can be reduced by adding the oxygen.

The oxygen adding unit may be equipped with a supply port through which a gas configured to add the oxygen is supplied, and the supply port is opened toward a center of the space between the substrate and the light irradiating unit. In this case, the addition of the oxygen to the downstream side of the gas flow is accelerated by a flow velocity of the gas for adding the oxygen when the gas is supplied.

The light irradiating unit may be further configured to irradiate the light for ashing to the oxygen-containing gas before being introduced into the space between the substrate and the light irradiating unit in the state that the gas flow of the oxygen-containing gas is formed between the substrate and the light irradiating unit by the gas flow forming unit. In this case, by activating the oxygen before the oxygen-containing gas is introduced into the space between the substrate and the light irradiating unit, the lack of active oxygen immediately after the introduction of the oxygen-containing gas can be suppressed, so that the uniformity of the ashing in the gas flow direction can be bettered.

The rotation control unit may control the rotating/holding unit to decrease a rotation speed of the substrate with a lapse of time from a beginning of the irradiating of the light for ashing to the substrate. The progression speed of the ashing under the same condition (hereinafter, simply referred to as "ashing rate") tends to decrease with a lapse of time. If the ashing rate is decreased while the substrate is being rotated, the effect of improving the uniformity through the rotation of the substrate is weakened. As a resolution, by decreasing the rotation speed of the substrate with the lapse of time from the beginning of the irradiation of the light for ashing to the substrate, the influence caused by the decrease of the ashing rate can be suppressed, so that the weakening of the effect of improving the uniformity can be suppressed.

The irradiation control unit may control the light irradiating unit to increase an irradiation amount of the light for ashing with a lapse of time from a beginning of the irradiating of the light for ashing to substrate. In this case, by increasing the irradiation amount of the light for ashing with the lapse of time from the beginning of the irradiation of the light for ashing to the substrate, the influence caused by the decrease of the ashing rate is suppressed, so that it is possible to reduce the deterioration of the effect of improving the uniformity.

The rotation control unit may control the rotating/holding unit to rotate the substrate two rounds or more in the state that the gas flow of the oxygen-containing gas is formed between the substrate and the light irradiating unit by the gas flow forming unit and the light for ashing is irradiated to the front surface of the substrate by the light irradiating unit. In this case, the decrease of the ashing rate when the substrate is rotated one round is reduced. Therefore, the weakening of the effect of improving the uniformity can be suppressed.

A substrate processing method includes forming a gas flow of an oxygen-containing gas to allow the oxygen-containing gas to pass through a space between a substrate having an organic film on a front surface thereof and a light irradiating unit configured to irradiate light for ashing; irradiating the light for ashing to the front surface of the substrate from the light irradiating unit in a state that the gas flow of the oxygen-containing gas is formed between the substrate and the light irradiating unit; and rotating the substrate in a state that the gas flow of the oxygen-containing gas is formed between the substrate and the light irradiating unit and the light for ashing is irradiated to the front surface of the substrate by the light irradiating unit.

The substrate processing method may further include changing a distance between the substrate and the light irradiating unit such that, in the state that the gas flow of the oxygen-containing gas is formed between the substrate and the light irradiating unit, the light for ashing is irradiated under multiple conditions where the distances between the substrate and the light irradiating unit are set to be different.

There is provided a computer-readable recording medium having stored thereon computer-executable instructions that, in response to execution, cause the substrate processing apparatus to perform the substrate processing method.

According to the exemplary embodiments as stated above, it is possible to provide the substrate processing apparatus and the substrate processing method which are effective to improve the uniformity of the aching processing upon the organic film formed on the front surface of the substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIGS. 8A and 8B are schematic diagrams illustrating states of the ashing unit when a wafer is carried in;

DETAILED DESCRIPTION

Figure 1:
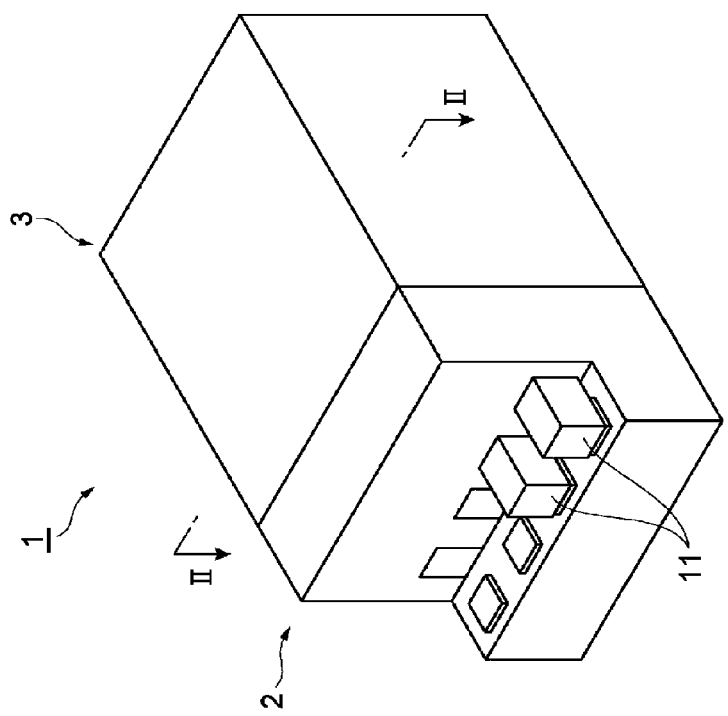
FIG. 1 a perspective view schematically illustrating a configuration of a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

<Substrate Processing Apparatus>

Figure 2:
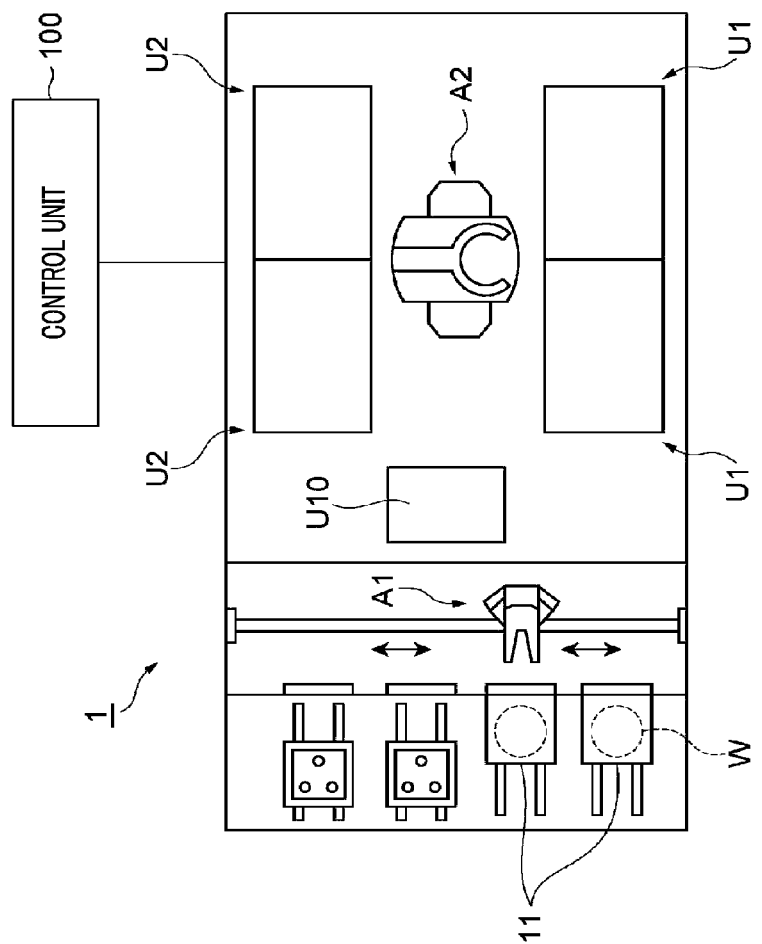
FIG. 2 is a cross sectional view taken along a line II-II of FIG. 1.

A substrate processing apparatus 1 according to an exemplary embodiment is configured to perform, on a substrate, formation of a protective film (organic film) and smoothing of a surface of the protective film by etching. The substrate as a processing target is, by way of example, a semiconductor wafer W. The protective film is a so-called hard mask such as, by way of non-limiting example, spin on carbon (SOC). As shown in FIG. 1 and FIG. 2, the substrate processing apparatus 1 is equipped with: a carrier block 2 and a processing block 3 adjacent to each other; and a control unit 100.

The carrier block 2 is configured to carry a wafer W into/out of the substrate processing apparatus 1. By way of example, the carrier block 2 is configured to support a plurality of carriers 11 for wafers W and incorporates therein a delivery arm A1. Each carrier 11 accommodates therein, for example, a multiple number of circular wafers W. The delivery arm A1 is configured to take out a wafer W from the carrier 11, deliver the wafer W to the processing block 3, receive the wafer W from the processing block 3 and return the wafer W back into the carrier 11.

The processing block 3 includes multiple liquid processing units U1, multiple aching units U2, and a transfer arm A2 configured to transfer the wafer W into these units. Each liquid processing unit U1 is configured to perform a processing of forming a film by supplying a processing liquid for formation of a hard mask onto a surface of the wafer W (hereinafter, referred to as "coating processing"). Each ashing unit U2 is configured to perform a heat treatment for turning the film into the hard mask and a processing of smoothing a surface of the hard mask by etching (hereinafter, referred to as "etching processing"). Within the processing block 3, a shelf unit U10 is provided at a side of the carrier block 2. The shelf unit U10 is partitioned into a multiple number of cells arranged in the vertical direction.

The control unit 100 is configured to control the carrier block 2 and the processing block 3 such that the coating processing, the heat treatment and the etching processing are performed on the wafer W. By way of example, the control unit 100 first controls the delivery arm A1 to carry the wafer W within the carrier 11 into the shelf unit U10. Then, the control unit 100 controls the transfer arm A2 to transfer the wafer W of the shelf unit U10 into the liquid processing unit U1, and controls the liquid processing unit U1 to perform the coating processing on the wafer W. Then, the control unit 100 controls the transfer arm A2 to transfer the wafer W from the liquid processing unit U1 into the ashing unit U2, and controls the ashing unit U2 to perform the heat treatment and the etching processing on the wafer W. Afterwards, the control unit 100 controls the transfer arm A2 to transfer the wafer W from the ashing unit U2 into the shelf unit U10, and controls the delivery arm A1 to return the wafer W from the shelf unit U10 back into the carrier 11. Through these operations, the coating processing, the heat treatment and the etching processing upon the single wafer W is completed.

<Ashing Unit>

Figure 3:
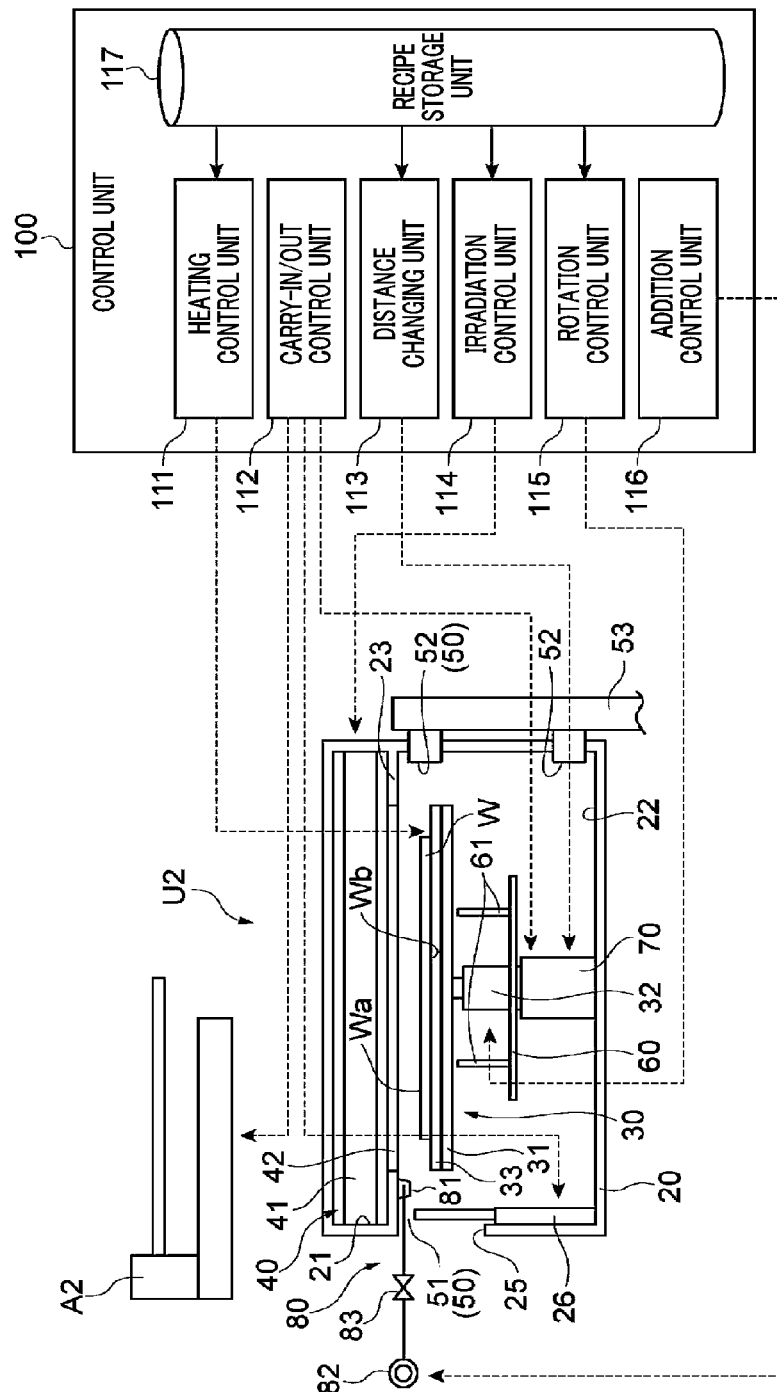
FIG. 3 is a cross sectional view schematically illustrating a configuration of an ashing unit.

Now, the ashing unit U2 will be elaborated. As depicted in FIG. 3, the ashing unit U2 is equipped with a rotating/holding unit 30 configured to hold and rotate the wafer W having the protective film on a front surface Wa thereof; a light irradiating unit 40 configured to irradiate light for ashing of the protective film to the front surface Wa of the wafer W held by the rotating/holding unit 30; and a gas flow forming unit 50 configured to form a gas flow of an oxygen-containing gas to allow the oxygen-containing gas to pass through a space between the wafer W held by the rotating/holding unit 30 and the light irradiating unit 40. As a more specific example, the ashing unit U2 includes a case 20, the rotating/holding unit 30, the light irradiating unit 40, the gas flow forming unit 50, a supporting member 60, a distance changing unit 70, and an oxygen adding unit 80.

The case 20 accommodates the individual components of the ashing unit U2 therein. The case 20 includes a partition wall 23, a carry-in/out opening 25 and a shutter 26. The partition wall 23 partitions the inside of the case 20 into a first space 21 at an upper side and a second space 22 at a lower side. A light source 41 to be described later is accommodated in the first space 21, and the gas flow forming unit 50, the supporting member 60, the distance changing unit 70 and the oxygen adding unit 80 are accommodated in the second space 22. The carry-in/out opening 25 is provided at a sidewall of the second space 22 and the wafer W is carried into/out of the second space 22 therethrough. The shutter 26 is configured to change a state of the carry-in/out opening 25 between an open state and a closed state by using, for example, an electric motor or an air cylinder as a power source. The open state is a state in which the wafer W can be carried in or out through the carry-in/out opening 25, and the closed state is a state in which the carry-in/carry-out of the wafer W through the carry-in/out opening 25 cannot be performed. Even in the closed state, the shutter 26 allows ventilation of the gas through the carry-in/out opening 25. That is, the shutter 26 closes the carry-in/out opening 25 while leaving an opening for the ventilation.

Figure 4:
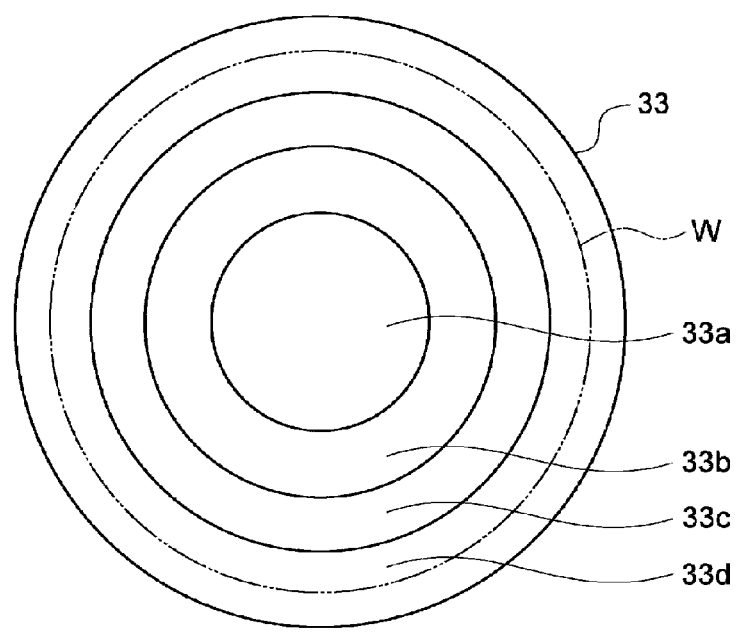
FIG. 4 is a schematic plan view of a heat plate.

The rotating/holding unit 30 includes a holding unit 31 and a rotational driving unit 32. The holding unit 31 is configured to support the wafer W, which is horizontally placed thereon with the front surface Wa facing upwards, from below. The holding unit 31 includes a heat plate 33. The heat plate 33 is provided to face a rear surface Wb of the wafer W. As shown in FIG. 4, the heat plate 33 includes a multiple number of heating regions arranged in the diametrical direction of the wafer W. By way of example, the heat plate 33 includes a plurality of (four in the shown example) heating regions 33a, 33b, 33c and 33d which are concentrically arranged outwards from a center of the wafer W. Each of the heating regions 33a to 33d incorporates a heater therein. With this configuration, it is possible to adjust temperature distributions of the heating regions 33a to 33d individually.

The rotational driving unit 32 is configured to rotate both the heat plate 33 and the wafer W held by the holding unit 31. By way of example, the rotational driving unit 32 uses an electric motor or the like as a power source and rotates the holding unit 31 around a vertical axis which passes through the centers of the wafer W and the heat plate 33.

Figure 5:
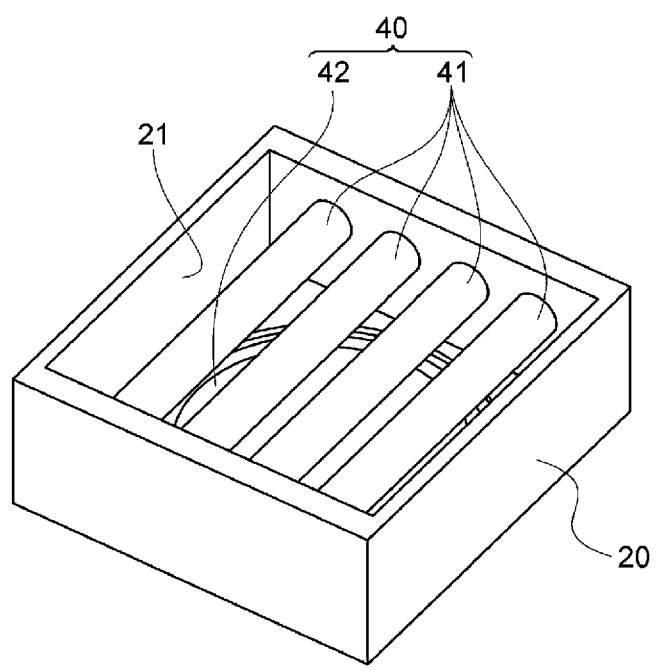
FIG. 5 is a schematic perspective view of an irradiating unit.

Referring back to FIG. 3, the light irradiating unit 40 includes the light source 41 and a window 42. The light source 41 is accommodated in the aforementioned first space 21, and configured to irradiate light for ashing of an organic film to the front surface Wa of the wafer W held by the holding unit 31. The light for ashing may be, by way of example, an ultraviolet ray having a wavelength ranging from 10 nm to 300 nm. The light source 41 is placed such that illuminance on the front surface Wa of the wafer W is non-uniform at least in a circumferential direction thereof. For example, the light irradiating unit 40 includes at least one rectangular tube-shaped light source 41 which is placed along a surface thereof facing the wafer W held by the holding unit 31. As depicted in FIG. 5, the light irradiating unit 40 may have multiple lines of the light sources 41 arranged in parallel to each other along a horizontal plane. In the shown example, though the light irradiating unit 40 is shown to have four light sources 41, the exemplary embodiment is not limited thereto. For example, the light irradiating unit 40 may have more than four light sources 41. The window 42 is provided at a position of the partition wall 23 corresponding to the holding unit 31, and transmits the light from the light source 41 into the second space 22.

Referring back to FIG. 3, the gas flow forming unit 50 forms a gas flow of the oxygen-containing gas (for example, air) so that the oxygen-containing gas passes through the space between the wafer W held by the rotating/holding unit 30 and the light irradiating unit 40. By way of example, the gas flow forming unit 50 creates the gas flow within the second space 22 such that the gas flows across a space between the window 42 and the wafer W. To elaborate, the gas flow forming unit 50 is equipped with an opening 51 and an exhaust port 52. The opening 51 is the opening provided at the carry-in/out opening 25 when the shutter 26 is closed. The exhaust port 52 is provided at a sidewall of the second space 22 opposite from the carry-in/out opening 25. The gas flow forming unit 50 may have multiple exhaust ports 52. By way of example, the gas flow forming unit 50 has two exhaust ports 52 vertically arranged at the opposite side from the carry-in/out opening 25. Each exhaust port 52 is connected to a duct 53 for gas exhaust and allows the gas to be exhausted from the inside of the second space 22 to the outside of the second space 22. With this configuration, a flow of the gas flowing from the carry-in/out opening 25 toward the inside of the second space 22 is formed within the second space 22. A part of this gas flow passes through the space between the window 42 and the wafer W and is exhausted from the exhaust ports 52 along with a sublimate produced in the aching processing.

In the state that the gas flow of the oxygen-containing gas is formed between the wafer W and the light irradiating unit 40 by the gas flow forming unit 50, the light irradiating unit 40 is configured to irradiate the light to the oxygen-containing gas before being introduced into the space between the wafer W and the light irradiating unit 40. By way of example, at least a part of a periphery of the window 42 at the opening 51 side is protruded outer than an edge of the wafer W. Accordingly, the light from the light source 41 is irradiated to the oxygen-containing gas which flows from the opening 51 toward the space between the wafer W and the light irradiating unit 40. Further, as depicted in FIG. 3, the periphery of the window 42 may be protruded outer than the edge of the wafer W at all sides thereof.

The supporting member 60 is provided under the holding unit 31 within the second space 22. The supporting member 60 includes a plurality of supporting pins 61 configured to be protruded upwards. Leading ends of the supporting pins 61 are protruded above or retracted below the heat plate 33 through the holding unit 31 and support the wafer W when the wafer W is carried into/out of the second space 22.

The distance changing unit 70 is configured to change a distance between the wafer W held by the rotating/holding unit 30 and the light irradiating unit 40. By way of example, the distance changing unit 70 is configured to move the rotating/holding unit 30 up and down by using an electric motor or an air cylinder as a power source. If the distance changing unit 70 raises the rotating/holding unit 30, the distance between the wafer W and the light irradiating unit 40 is decreased, whereas if the distance changing unit 70 lowers the rotating/holding unit 30, the distance between the wafer W and the light irradiating unit 40 is increased. Further, the distance changing unit 70 also serves as a mechanism in which the leading ends of the supporting pins 61 of the supporting member 60 are protruded above or retracted below the heat plate 33. To elaborate, if the distance changing unit 70 lowers the rotating/holding unit 30, the supporting pins 61 penetrate the holding unit 31 and the leading ends of the supporting pins 61 are protruded above the heat plate 33.

The oxygen adding unit 80 is configured to add oxygen to the oxygen-containing gas which flows toward the space between the wafer W and the light irradiating unit 40 from the opening 51. By way of example, the oxygen adding unit 80 includes a nozzle 81 opened between the opening 51 and the edge of the wafer W; an oxygen source 82 configured to supply the oxygen into the nozzle 81; and a valve 83 configured to open or close a path leading to the nozzle 81 from the oxygen source 82. An opening (supply port) of the nozzle 81 may be opened toward a center of the space between the wafer W and the light irradiating unit 40. Further, it is desirable that the oxygen source 82 is configured to supply, as a gas for addition of the oxygen, a gas having an oxygen concentration higher than at least that of the oxygen-containing gas to the nozzle 81.

The ashing unit U2 having the above-described configuration is controlled by the control unit 100. The control unit 100 is configured to control the light irradiating unit 40 to irradiate the light for ashing to the front surface Wa of the wafer W in the state that the gas flow of the oxygen-containing gas is formed between the wafer W and the light irradiating unit 40 by the gas flow forming unit 50, and control the rotating/holding unit 30 to rotate the wafer W in the state that the gas flow of the oxygen-containing gas is formed between the wafer W and the light irradiating unit 40 by the gas flow forming unit 50 and the light for ashing is irradiated to the front surface Wa of the wafer W by the light irradiating unit 40 (hereinafter, referred to as "irradiation state with the gas flow").

The control unit 100 may be further configured to control the heat plate 33 to adjust a temperature distribution under a condition that a difference in the progression of the ashing is reduced in the regions arranged in the diametrical direction of the wafer W, and may be further configured to control the light irradiating unit 40 to adjust an irradiation amount of the light for ashing under the condition that the difference in the progression of the ashing is reduced in the regions arranged in the diametrical direction of the wafer W. The control unit 100 may be further configured to control the distance changing unit 70 to change the distance between the wafer W and the light irradiating unit 40 such that the light for ashing is irradiated, in the state that the gas flow of the oxygen-containing gas is formed between the wafer W and the light irradiating unit 40, under multiple conditions where the distances between the wafer W and the light irradiating unit 40 are set to be different.

The control unit 100 may be further configured to control the oxygen adding unit 80 to add the oxygen to the oxygen-containing gas before being introduced into the space between the wafer W and the light irradiating unit 40 in the irradiation state with the gas flow. The control unit 100 may be further configured to control the rotating/holding unit 30 to reduce a rotation speed of the wafer W with a lapse of time from the beginning of the irradiation of the light for ashing to the wafer W, and may be further configured to control the light irradiation unit 40 to increase the irradiation amount of the light for ashing with the lapse of time from the beginning of the irradiation of the light for ashing to the wafer W. The control unit 100 may be configured to control the rotating/holding unit 30 to rotate the wafer W at least two rounds in the irradiation state with the gas flow.

By way of example, the control unit 100 includes, as functional components (hereinafter, referred to as "functional modules") for controlling the ashing unit U2, a heating control unit 111, a carry-in/out control unit 112, a distance change control unit 113, an irradiation control unit 114, a rotation control unit 115, an addition control unit 116 and a recipe storage unit 117.

The heating control unit 111 controls the heat plate 33 to adjust the temperature distribution under the condition that the difference in the progression of the ashing is reduced in the regions arranged in the diametrical direction of the wafer W. By way of example, the heating control unit 111 controls the heat plate 33 to decrease a temperature of a heating region corresponding to a region where a progression speed of the ashing (hereinafter, referred to as "ashing rate") is increased in a case that the temperature distribution is uniform and to increase a temperature of a heating region corresponding to a region where the ashing rate is decreased in a case that the temperature distribution is uniform. The carry-in/out control unit 112 controls the shutter 26, the distance changing unit 70 and the transfer arm A2 to allow the wafer W to be carried into/out of the second space 22.

The distance change control unit 113 controls the distance changing unit 70 to change the distance between the wafer W and the light irradiating unit 40 such that the light for ashing is irradiated, in the state that the gas flow of the oxygen-containing gas is formed between the wafer W and the light irradiating unit 40, under the multiple conditions where the distance between the wafer W and the light irradiating unit 40 is set differently. If the distance between the gas flow forming unit 50 and the light irradiating unit 40 is increased, it becomes easier for the oxygen to reach a downstream side of the gas flow. Therefore, if the distance between the gas flow forming unit 50 and the light irradiating unit 40 is increased, the progression of the ashing tends to become faster at the downstream side of the gas flow. The distance change control unit 113 changes the distance between the gas flow forming unit 50 and the light irradiating unit 40 within a range including a first distance at which the progression of the ashing at a central portion (including a center) of the wafer W is increased as compared to that of an edge portion (near the edge) of the wafer W and a second distance at which the progression of the ashing at the central portion of the wafer W is decreased as compared to that of the edge portion thereof.

The irradiation control unit 114 controls the light irradiating unit 40 to irradiate the light for ashing to the front surface Wa of the wafer W in the state that the gas flow of the oxygen-containing gas is formed between the wafer W and the light irradiating unit 40 by the gas flow forming unit 50. The irradiation control unit 114 may control the light irradiating unit 40 to adjust the irradiation amount of the light for ashing under the condition that the difference in the progression of the ashing is reduced in the regions arranged in the diametrical direction of the wafer W. By way of example, the irradiation control unit 114 controls the light irradiating unit 40 to decrease the irradiation amount to a region where the ashing rate is increased in a case that the irradiation amount is uniform and to increase the irradiation amount to a region where the ashing rate is decreased in the case that the irradiation amount is uniform. The irradiation control unit 114 controls the light irradiating unit 40 to increase the irradiation amount of the light for ashing with a lapse of time from the beginning of the irradiation of the light for ashing to the wafer W.

The rotation control unit 115 controls the rotating/holding unit 30 to rotate the wafer W in the irradiation state with the gas flow. The rotation control unit 115 may control the rotating/holding unit 30 to decrease the rotation speed of the wafer W with a lapse of time from the beginning of the irradiation of the light for ashing to the wafer W. The rotation control unit 115 may control the rotating/holding unit 30 to rotate the wafer W at least two rounds or more in the irradiation state with the gas flow.

The addition control unit 116 controls the oxygen adding unit 80 to add the oxygen to the oxygen-containing gas before being introduced into the space between the wafer W and the light irradiating unit 40 in the irradiation state with the gas flow.

The recipe storage unit 117 stores therein previously set control parameters. The control parameters include control target values (e.g., temperature target values of the individual heating regions) for the heat plate 33 previously set for the control of the heating control unit 11, a control target value (e.g., a height target value of the holding unit 31) for the distance changing unit 70 previously set for the control of the distance change control unit 113, a control target value (e.g., light amount target values of the individual light sources 41) for the light irradiating unit 40 previously set for the control of the irradiation control unit 114, and a control target value (e.g., a rotation speed target value or a rotation number of the holding unit 31, etc.) for the rotating/holding unit 30 previously set for the control of the rotation control unit 115.

Figure 6:
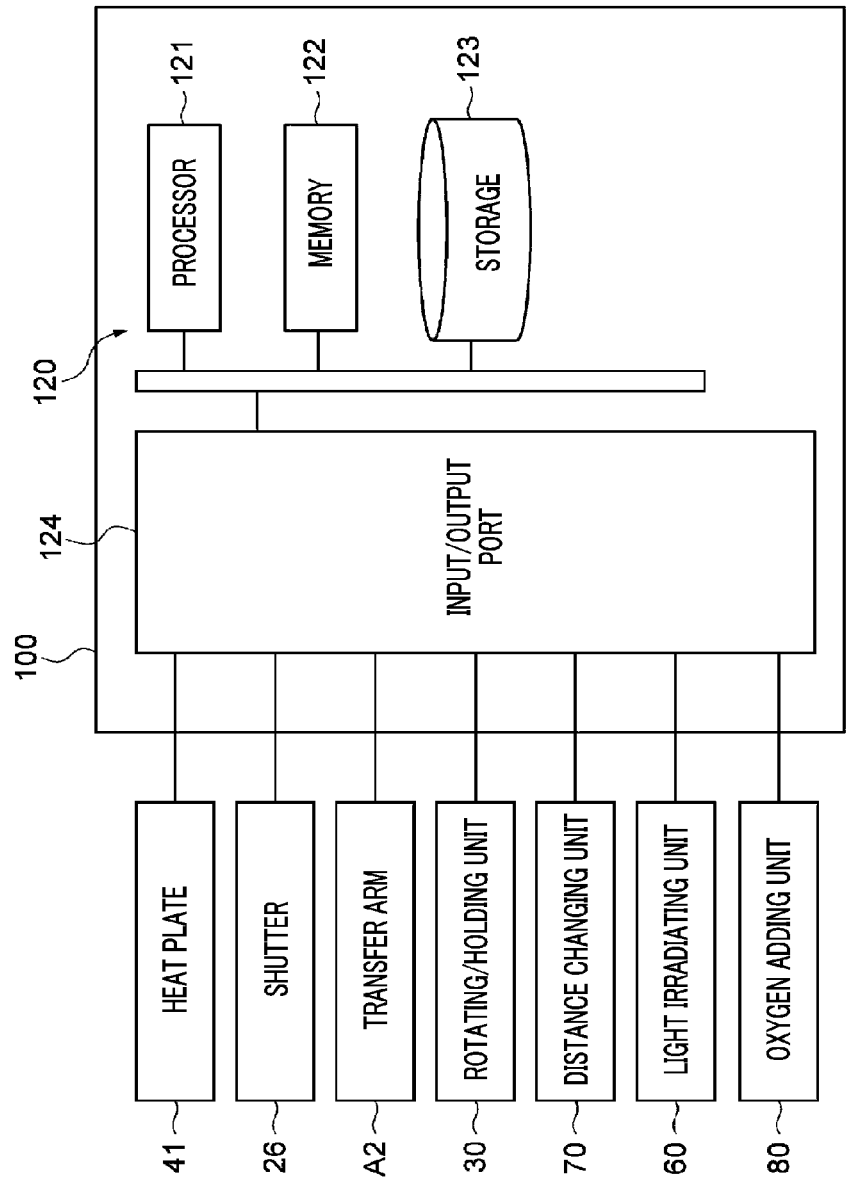
FIG. 6 is a block diagram illustrating a hardware configuration of a control unit.

The control unit 100 includes one or more control computers. For example, the control unit 100 is equipped with a circuit 120 shown in FIG. 6. The circuit 120 includes one or more processors 121, a memory 122, a storage 123, and an input/output port 124. The storage 123 has a computer-readable recording medium such as a hard disk. The recording medium stores therein a program for allowing the aching unit U2 to implement a substrate processing sequence to be described later. The recording medium may be an extractable medium such as a non-volatile semiconductor memory, a magnetic disk or an optical disk. The memory 122 temporarily stores therein the program loaded from the recording medium of the storage 123 and an operation result by the processor 121. The processor 121 constitutes the aforementioned individual functional modules by executing the program in cooperation with the memory 122. The input/output port 124 performs input/output of signals between the heat plate 33, the shutter 26, the transfer arm A2, the rotating/ holding unit 30, the light irradiating unit 40, the distance changing unit 70 and the oxygen adding unit 80 in response to instructions from the processor 121. The hardware configuration of the control unit 100 is not necessarily limited to constituting the individual functional modules by the program. By way of example, the individual functional modules of the control unit 100 may be composed of exclusive logical circuits or an ASIC (Application Specific Integrated Circuit) in which these logical circuits are integrated.

<Substrate Processing Method>

Now, the substrate processing sequence performed by the ashing unit U2 will be explained as an example of a substrate processing method. This substrate processing sequence includes forming the gas flow of the oxygen-containing gas to allow the oxygen-containing gas to pass through the space between the wafer W and the light irradiating unit 40; irradiating the light for ashing to the front surface Wa of the wafer W from the light irradiating unit 40 in the state that the gas flow of the oxygen-containing gas is formed between the wafer W and the light irradiating unit 40; and rotating the wafer W in the irradiation state with the gas flow. Below, referring to FIG. 7 to FIG. 15B, a specific example of the substrate processing sequence will be described. Further, the substrate processing sequence of FIG. 7 to FIG. 15B is performed in the state that the forming of the gas flow by the gas flow forming unit 50 is continued (that is, in the state that the gas exhaust from the exhaust port 52 is continued).

Figure 7:
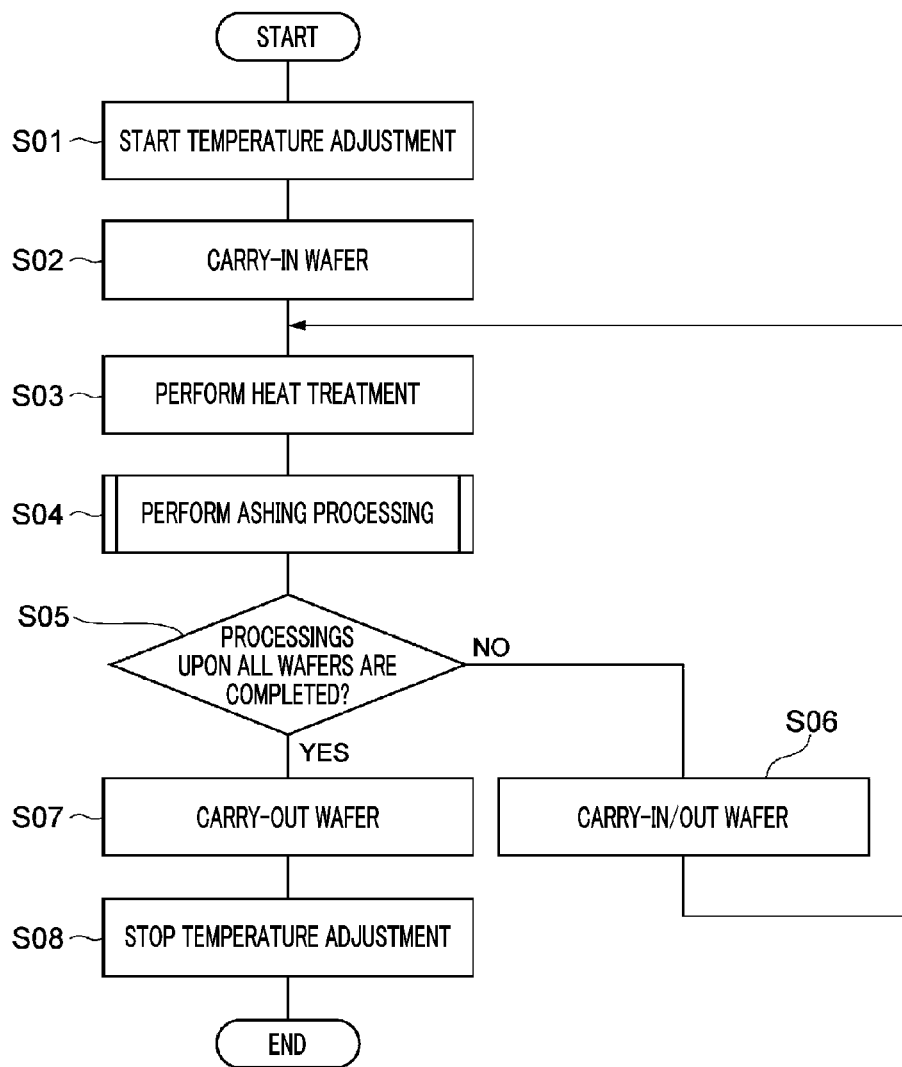
FIG. 7 is a flowchart for describing a processing sequence performed by the ashing unit.
Figure 8A:
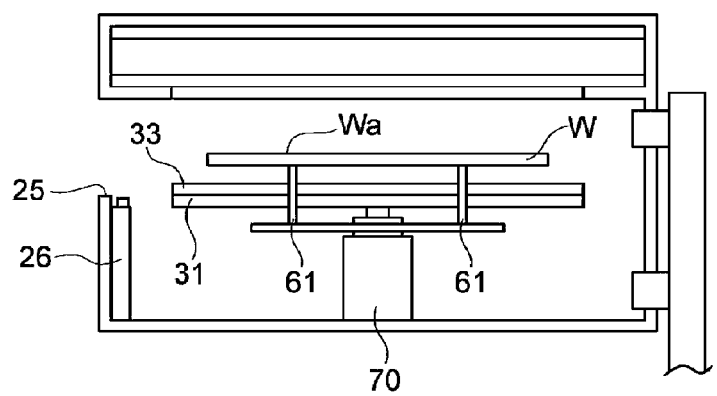
Figure 8B:
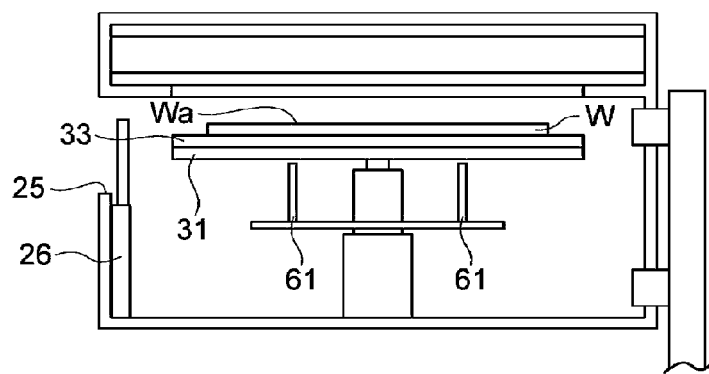

As shown in FIG. 7, the control unit 100 first performs processes S01 and S02. In the process S01, the heating control unit 111 controls the heat plate 33 to start the temperature adjustment of each heating region based on the temperature target value for the heat treatment stored in the recipe storage unit 117. In the process S02, the carry-in/out control unit 112 performs a control for carrying the wafer W into the second space 22.

By way of example, the carry-in/out control unit 112 controls the shutter 26 to change a state of the carry-in/out opening 25 from the closed state to the open state, and controls the distance changing unit 70 to lower the holding unit 31 to a position where the leading ends of the supporting pins 61 are protruded above the heat plate 33 (hereinafter, referred to as "carry-in/out position"). Thereafter, the carry-in/out control unit 112 controls the transfer arm A2 to carry the wafer W into the second space 22 through the carry-in/out opening 25 and place the carried wafer W on the supporting pins 61 horizontally with the front surface Wa facing upwards (see FIG. 8A). Thereafter, the carry-in/out control unit 112 controls the shutter 26 to change the state of the carry-in/out opening 25 from the open state to the closed state, and controls the distance changing unit 70 to raise the holding unit 31 until the leading ends of the supporting pins 61 are located below the heat plate 33 (see FIG. 8B). With these operations, the wafer W is placed on the heat plate 33, and heating of the wafer W by the heat plate 33 is begun.

Subsequently, the control unit 100 performs processes S03, S04 and S05. In the process S03, the heating control unit 111 waits for a lapse of a preset time stored in the recipe storage unit 117. The preset time is previously set to allow the turning of the organic film into the hard mask to be sufficiently performed. The process S04 includes an ashing processing of irradiating the light for ashing to the organic film on the front surface Wa of the wafer W. A specific sequence of the ashing processing will be elaborated later. Then, the control unit 100 performs the process S05. In the process S05, the carry-in/out control unit 112 determines whether processings upon all wafers W as the processing targets are completed.

If it is determined in the process S05 that the processings upon all the wafers W are not completed, the control unit 100 performs a process S06. In the process S06, the carry-in/out control unit 112 performs a control of carrying the wafer W out of the second space 22 and carrying a next wafer W into the second space 22. For example, the carry-in/out control unit 112 controls the shutter 26 to change the state of the carry-in/out opening 25 from the closed state to the open state, and controls the distance changing unit 70 to lower the holding unit 31 to the aforementioned carry-in/out position. Thereafter, the carry-in/out control unit 112 controls the transfer arm A2 to carry the wafer W out of the second space 22 through the carry-in/out opening 25, carry the next wafer W into the second space 22 through the carry-in/out opening 25, and place the carried next wafer W on the supporting pins 61 horizontally with the front surface Wa thereof facing upwards. Then, the carry-in/out control unit 112 controls the shutter 26 to change the state of the carry-in/out opening 25 from the open state to the closed state, and controls the distance changing unit 70 to raise the holding unit 31 until the leading ends of the supporting pins 61 are located below the heat plate 33 (see FIG. 8B). After the process S06, the control unit 100 returns the processing back to the process S03. Thereafter, the heat treatment and the aching processing are repeated until the processings upon all the wafers W are completed.

If it is determined in the process S05 that the processings upon all the wafers W are completed, the control unit 100 performs processes S07 and S08. In the process S07, the carry-in/out control unit 112 performs a control of carrying the wafer W out of the second space 22. By way of example, the carry-in/out control unit 112 controls the shutter 26 to change the state of the carry-in/out opening 25 from the closed state to the open state, and controls the distance changing unit 70 to lower the holding unit 31 to the aforementioned carry-in/out position. Then, the carry-in/out control unit 112 controls the transfer arm A2 to carry the wafer W out of the second space 22 through the carry-in/out opening 25. Thereafter, the carry-in/out control unit 112 controls the shutter 26 to change the state of the carry-in/out opening 25 from the open state to the closed state. In the process S08, the heating control unit 111 controls the heat plate 33 to stop the heating. Through these operations, the sequence of the controls over the ashing unit U2 by the control unit 100 is completed.

(Aching Processing Sequence)

Figure 9:
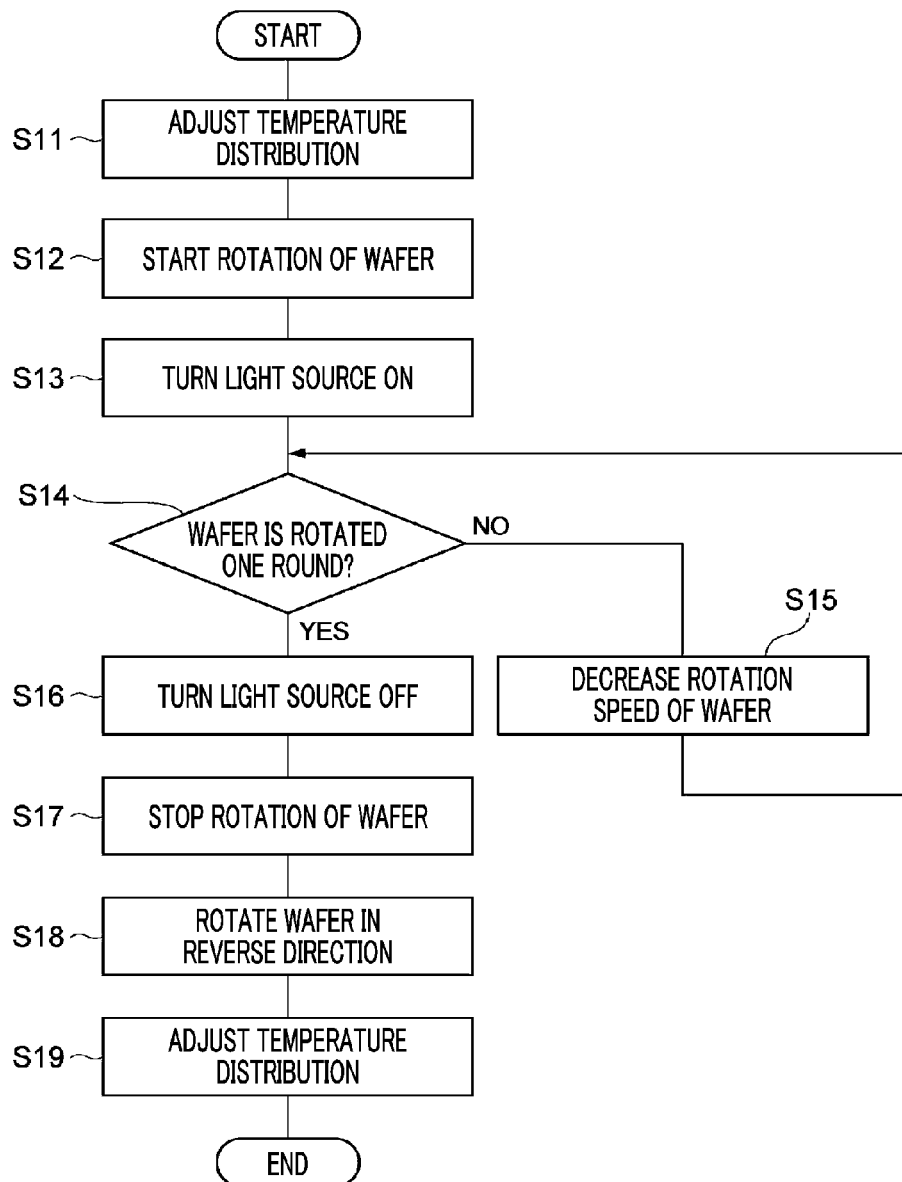
FIG. 9 is a flowchart showing an ashing processing sequence.
Figure 10:
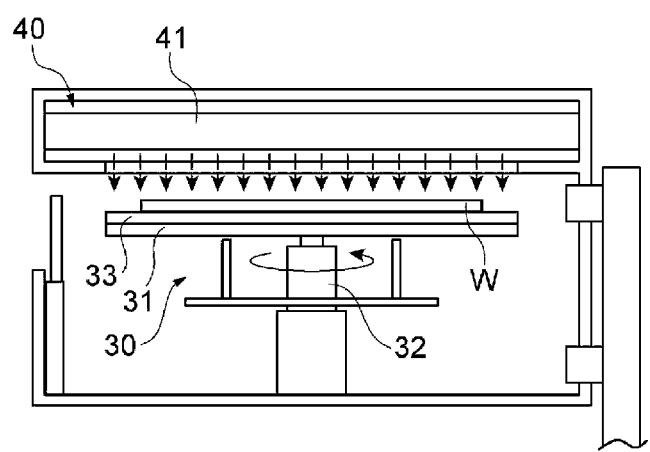
FIG. 10 is a schematic diagram illustrating a state of the ashing unit when light for ashing is irradiated.

Now, an example of the specific sequence of the ashing processing in the process S04 will be explained. As depicted in FIG. 9, the control unit 100 first performs processes S11, S12 and S13. In the process S11, the heating control unit 111 controls the heat plate 33 to change a temperature of each heating region based on the temperature target value for the ashing processing stored in the recipe storage unit 117. The temperature target value for the ashing processing is previously set to decrease the temperature of the heating region corresponding to the region where the ashing rate is increased when the temperature distribution is uniform and to increase the temperature of the heating region corresponding to the region where the ashing rate is decreased when the temperature distribution is uniform. In the process S12, the rotation control unit 115 controls the rotating/holding unit 30 to start rotating of the holding unit 31 by the rotational driving unit 32. As a result, the rotation of the wafer W and the heat plate 33 is begun. In the process S13, the irradiation control unit 114 controls the light irradiating unit 40 to turn the light source 41 on.

Thereafter, the control unit 100 performs a process S14. In the process S14, the rotation control unit 115 determines whether the wafer W is rotated one round (that is, whether a rotation angle of the wafer W has reached 360°) after the light source 41 is turned on. If it is determined in the process S14 that the wafer W has not rotated one round yet, the control unit 100 performs a process S15. In the process S15, the rotation control unit 115 controls the rotating/holding unit 30 to decrease a rotation speed of the holding unit 31 at a deceleration pitch stored in the recipe storage unit 117.

Here, a progression speed of the ashing under the same condition (hereinafter, simply referred to as "ashing rate") tends to decrease with a lapse of time. If the ashing rate is decreased while the wafer W is being rotated, an effect of improving uniformity through the rotation of the wafer W is weakened. As a resolution, by decreasing the rotation speed of the wafer W with the lapse of time from the beginning of the irradiation of the light for ashing to the wafer W, an influence caused by the decrease of the ashing rate can be suppressed, so that the weakening of the effect of improving the uniformity can be suppressed. The aforementioned deceleration pitch is previously set to suppress the influence of the decrease of the ashing rate.

After the process S15, the control unit 100 returns the processing back to the process S14. Then, until the wafer W is rotated completely one round, the control unit 100 controls, in the irradiation state with the gas flow, the rotating/holding unit 30 to continue the rotation of the wafer W by the rotational driving unit 32 while gradually decreasing the rotation speed (see FIG. 10).

If it is determined in the process S14 that the wafer W has been rotated one round, the control unit 100 performs processes S16, S17, S18 and S19. In the process S16, the irradiation control unit 114 controls the light irradiating unit 40 to turn the light source 41 off. In the process S17, the rotation control unit 115 controls the rotating/holding unit 30 to stop the rotating of the holding unit 31 by the rotational driving unit 32. In the process S18, the rotation control unit 115 controls the rotating/holding unit 30 to rotate the holding unit 31 in the reverse direction up to a position where it is located before the process S12 is performed. In the process S19, the heating control unit 111 controls the heat plate 33 to return the temperature of each heating region to the aforementioned temperature for the heat treatment. With these operations, the ashing processing is completed.

Further, in the process S15, instead of decreasing the rotation speed of the holding unit 31, the irradiation control unit 114 may control the light irradiating unit 40 to increase the irradiation amount of the light for ashing at an increment pitch stored in the recipe storage unit 117. This increment pitch is previously set to suppress the aforementioned influence caused by the decrease of the ashing rate. Further, in the process S15, the decreasing of the rotation speed of the holding unit 31 at the deceleration pitch stored in the recipe storage unit 117 and the increasing of the irradiation amount of the light for ashing at the increment pitch stored in the recipe storage unit 117 may be both performed. Further, the rotation control unit 115 may not perform the process S15 but control the rotating/holding unit 30 to continue the rotation of the wafer W by the rotational driving unit 32 at a substantially constant rotation speed. Below, modification examples of the ashing processing sequence will be further explained.

First Modification Example

Figure 11:
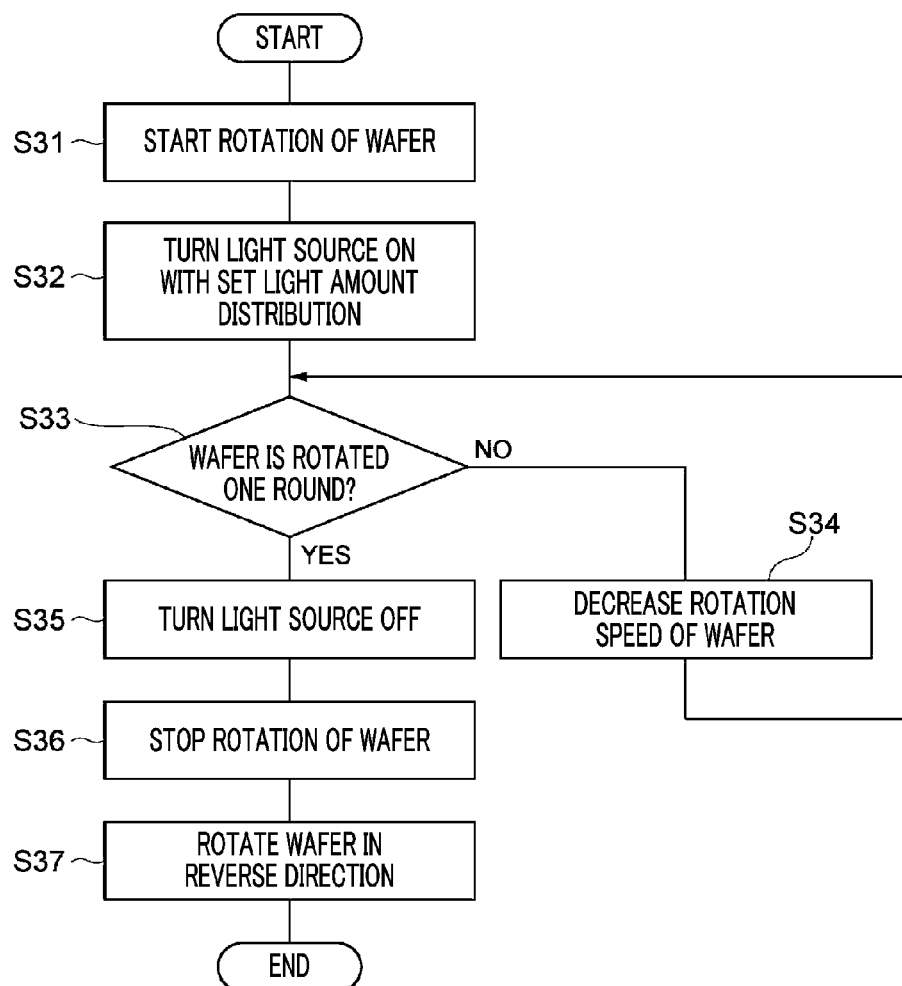
FIG. 11 is a flowchart showing a modification example of the ashing processing sequence.

Processes S31 to S37 of FIG. 11 show a sequence in which the processes S11 and S19 regarding the temperature adjustment are omitted from the ashing processing sequence of FIG. 9 and the light source 41 is turned on by adjusting a light amount distribution instead. The processes S31 to S37 correspond to the processes S12 to S18, respectively.

In the process S32 regarding the turning-on of the light source 41, the irradiation control unit 114 controls the light irradiating unit 40 to turn each light source 41 on in the light amount distribution for ashing stored in the recipe storage unit 117. The light amount distribution for ashing is set to decrease the irradiation amount to a region where the ashing rate increases when the irradiation amount is uniform and to increase the irradiation amount to a region where the ashing rate decreases when the irradiation amount is uniform. The process S31 is the same as the process S12, and the processes S33 to S37 are the same as the processes S14 to S18, respectively. Further, the processes S11 and S19 regarding the temperature adjustment and the process S32 regarding the irradiation amount adjustment may be performed in combination.

Second Modification Example

Figure 12:
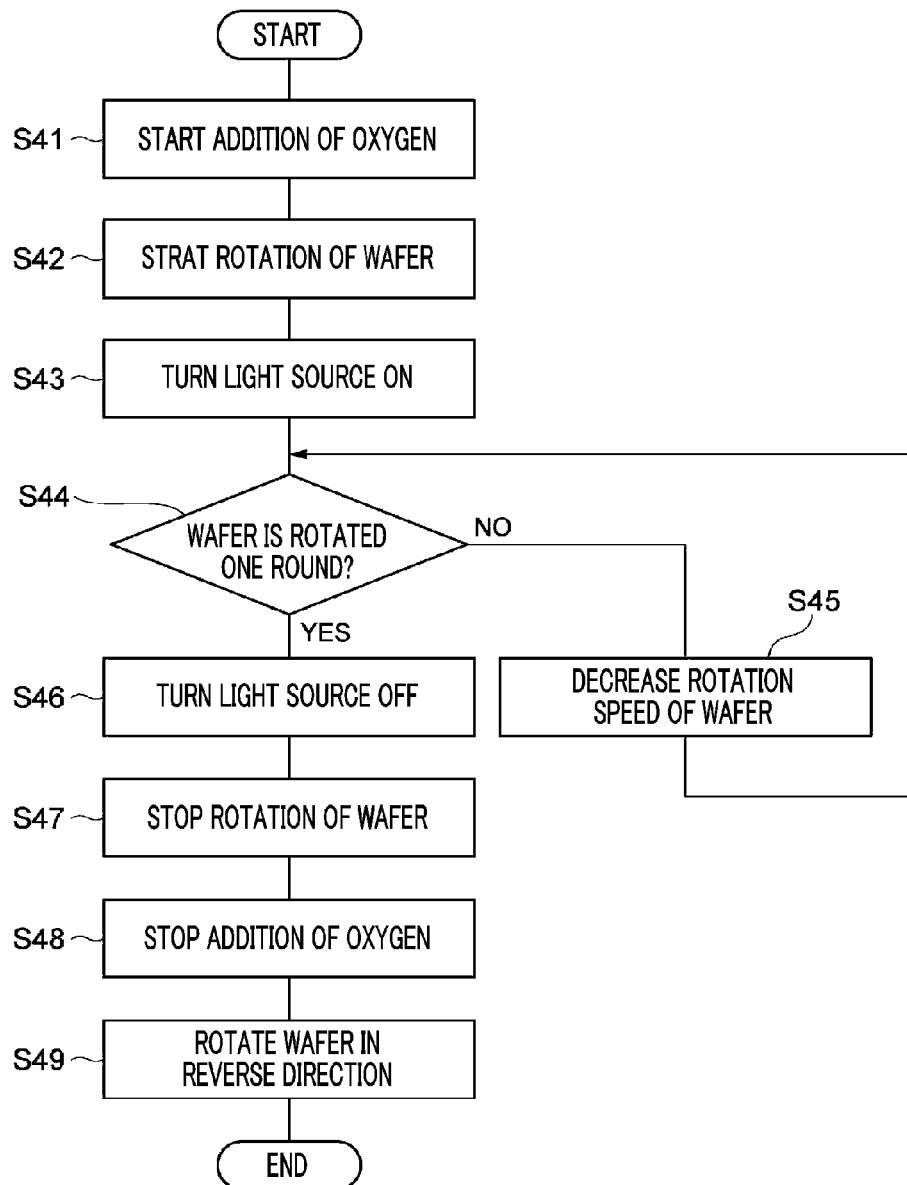
FIG. 12 is a flowchart showing another modification example of the ashing processing sequence.

Processes S41 to S49 of FIG. 12 show a sequence in which the processes S11 and S19 regarding the temperature adjustment in the aching processing sequence of FIG. 9 are omitted, and processes S41 and S48 regarding addition of oxygen by the oxygen adding unit 80 are added instead. The processes S42 to S47 and the process S49 are the same as the processes S12 to S18, respectively. In the process S41 of starting the addition of the oxygen, the addition control unit 116 controls the oxygen adding unit 80 to open the valve 83. Accordingly, the addition of the oxygen to the oxygen-containing gas is begun. In the process S48 of stopping the addition of the oxygen, the addition control unit 116 controls the oxygen adding unit 80 to close the valve 83. Accordingly, the addition of the oxygen to the oxygen-containing gas is stopped.

FIG. 12 illustrates a case in which the process S41 of starting the addition of the oxygen is performed before the process S42 of starting the rotation of the wafer W and the process S48 is performed between the process S47 of stopping the rotation of the wafer W and the process S49 of rotating the wafer W in the reverse direction. However, the exemplary embodiment is not limited thereto. The process S41 of starting the addition of the oxygen only needs to be performed at least before the process S43 of turning the light source 41 on, and the process S48 of stopping the addition of the oxygen only needs to be performed at least after the process S46 of turning the light source 41 off. Furthermore, the processes S11 and S19 regarding the temperature adjustment, the process S32 regarding the irradiation amount adjustment according to the first modification example, and the processes S41 and S48 regarding the addition of the oxygen according to the second modification example may be performed in combination.

Third Modification Example

Figure 13:
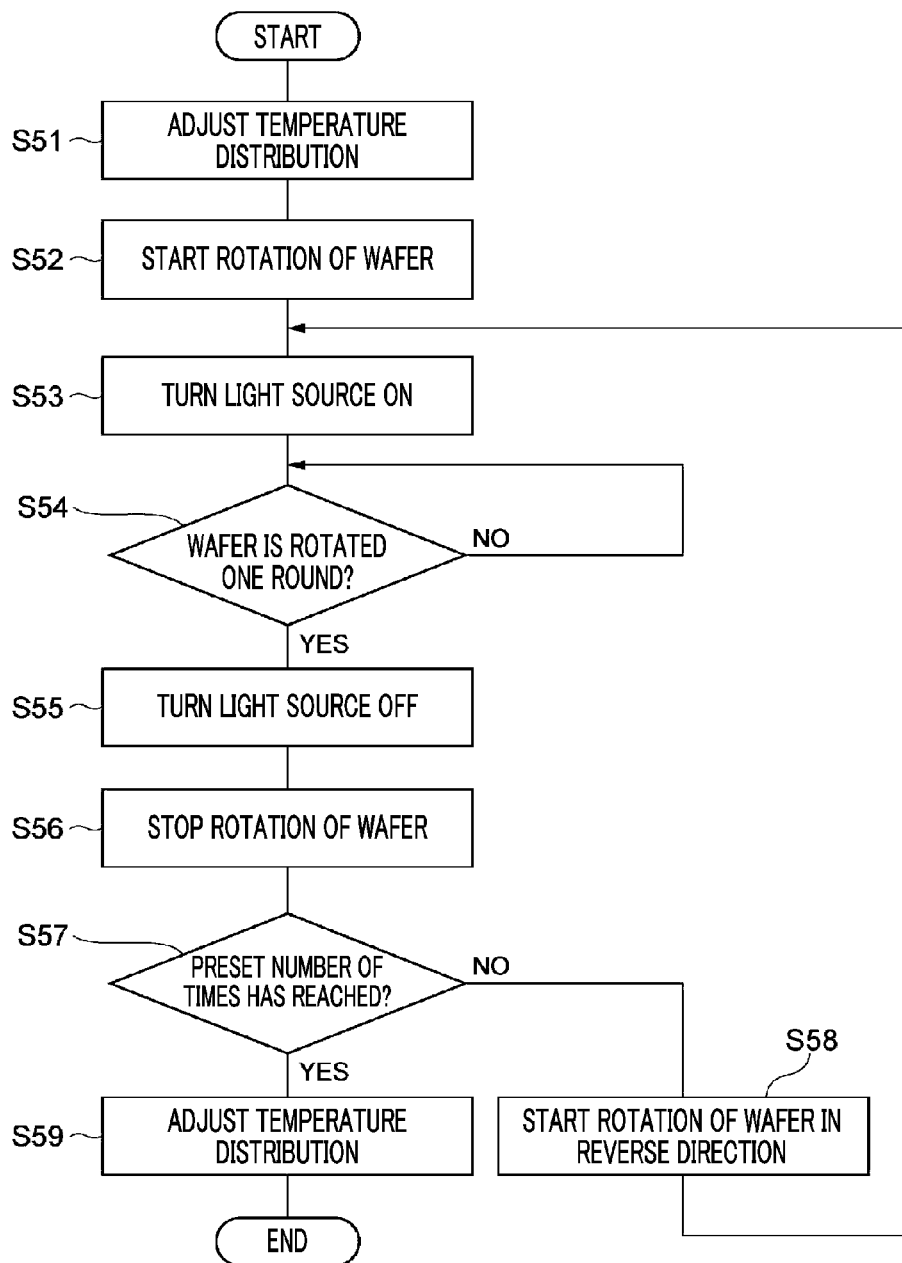
FIG. 13 is a flowchart showing yet another modification example of the ashing processing sequence.

Processes S51 to S59 of FIG. 13 show a sequence in which the processes S11 to S19 of FIG. 9 are modified to rotate the wafer W at least two rounds while the light source 41 is turned on. As depicted in FIG. 13, the control unit 100 first performs the processes S51, S52 and S53 which are the same as the processes S11, S12 and S13, respectively. In the process S51, the heating control unit 111 controls the heat plate 33 to change the temperature of each heating region based on the temperature target value for the aching processing stored in the recipe storage unit 117. In the process S52, the rotation control unit 115 controls the rotating/holding unit 30 to start the rotating of the holding unit 31 by the rotational driving unit 32. In the process S53, the irradiation control unit 114 controls the light irradiating unit 40 to turn the light source 41 on.

Subsequently, the control unit 100 performs the process S54. In the process S54, the rotation control unit 115 waits for the wafer W to be rotated one round after the light source 41 is turned on. Then, the control unit 100 performs the processes S55 and S56 which are the same as the processes S16 and S17, respectively. In the process S55, the irradiation control unit 114 controls the light irradiating unit 40 to turn the light source 41 off. In the process S56, the rotation control unit 115 controls the rotating/holding unit 30 to stop the rotating of the holding unit 31 by the rotational driving unit 32.

Then, the control unit 100 performs the process S57. In the process S57, the rotation control unit 115 checks whether the rotation number of the wafer W has reached a preset number of times set in the recipe storage unit 117. The preset number of times is previously set to be two rounds or more. If it is determined in the process S57 that the rotation number of the wafer W has not reached the preset number of times, the control unit 100 performs the process S58. In the process S58, the rotation control unit 115 controls the rotating/holding unit 30 to reverse the rotation direction and start the rotating of the holding unit 31 by the rotational driving unit 32. After the process S58, the control unit 100 returns the processing back to the process S53. Then, the operation of rotating the wafer W one round while the light source 41 is turned on is repeated until the rotation number of the wafer W reaches the preset number of times.

If it is determined in the process S57 that the rotation number of the wafer W has reached the preset number of times, the control unit 100 performs the process S59 which is the same as the process S19. In the process S59, the heating control unit 111 controls the heat plate 33 to return the temperature of each heating region to the aforementioned temperature for the heat treatment. Through the above-described operations, the aching processing is completed.

Further, the same as in the modification described in the processes S51 to S59, the rotation number of the wafer W may be set to be two rounds or more in the sequence according to the first modification example or in the sequence according to the second modification example. Moreover, in a sequence in which the processes S11 and S19 regarding the temperature adjustment, the process S32 regarding the irradiation amount adjustment according to the first modification example, and the processes S41 and S48 regarding the addition of the oxygen according to the second modification example are combined, the rotation number of the wafer W may be set to be two rounds or more. In addition, the rotation control unit 115 may control the rotating/holding unit 30 to decrease the rotation speed of the holding unit 31 by the rotational driving unit 32 whenever the wafer W is rotated one round. Still further, the irradiation control unit 114 may control the light irradiating unit 40 to increase the irradiation amount of the light for ashing whenever the wafer W is rotated one round.

Fourth Modification Example

Figure 14:
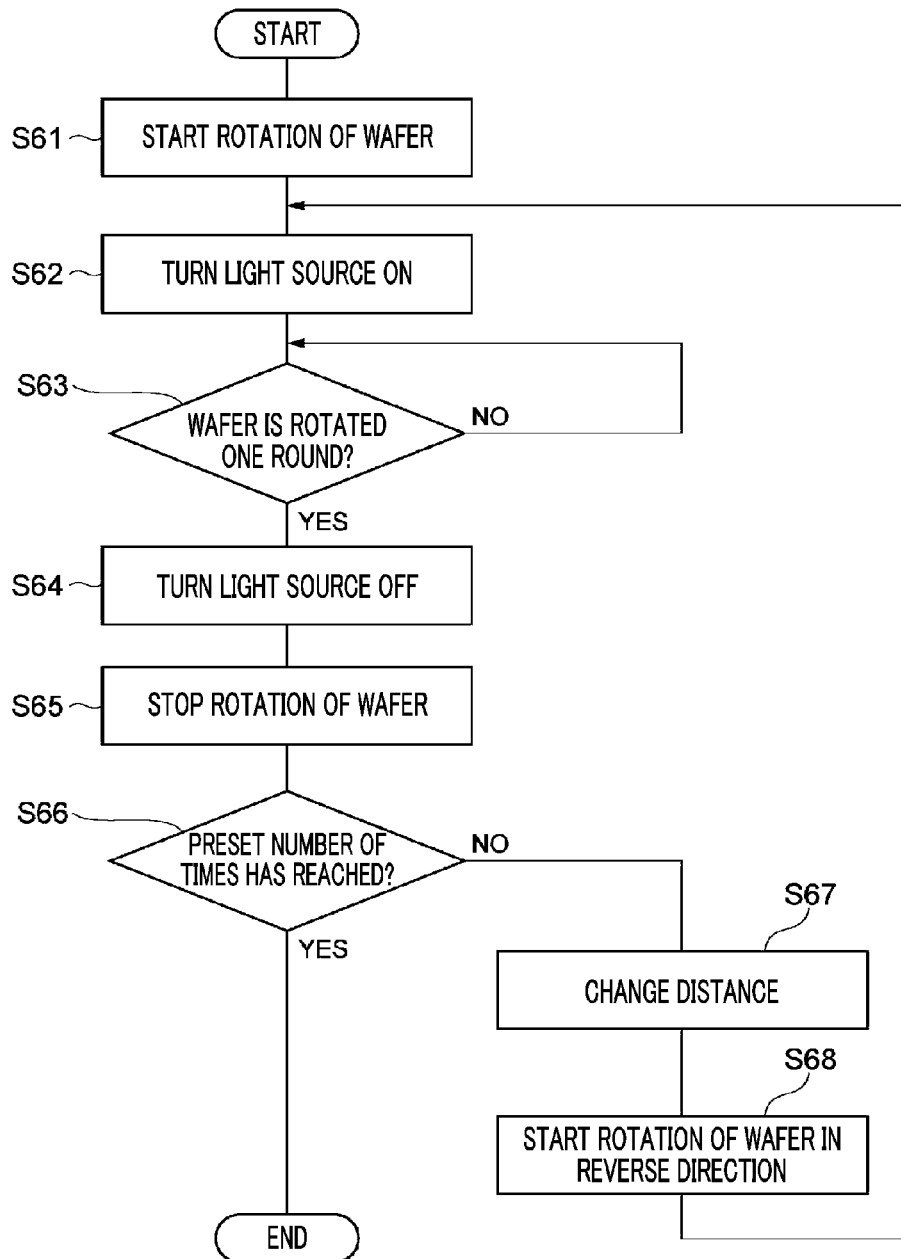
FIG. 14 is a flowchart showing still yet another modification example of the ashing processing sequence.
Figure 15A:
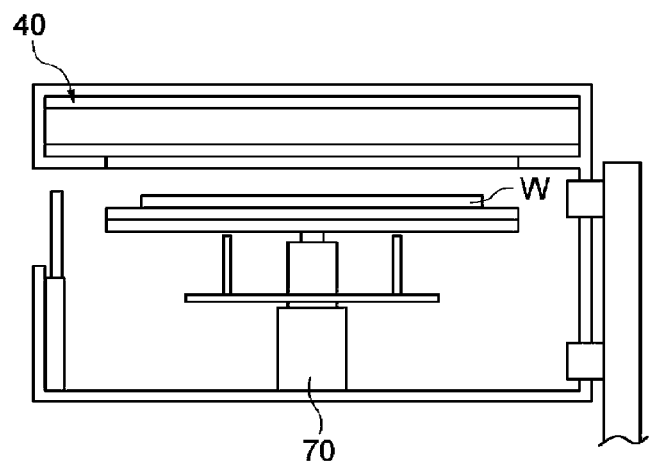
FIGS. 15A and 15B are schematic diagrams illustrating states of the ashing unit when a distance between the wafer and a light irradiation unit is changed.
Figure 15B:
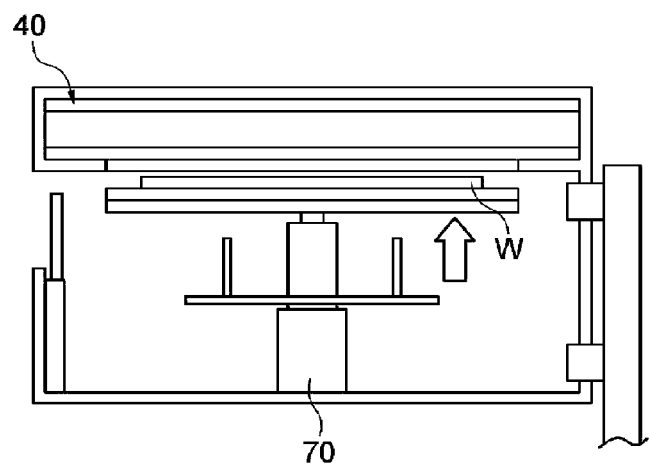

Processes S61 to S68 of FIG. 14 show a sequence in which the processes S51 and S59 regarding the temperature adjustment are omitted from the ashing processing sequence of FIG. 13 and a process S67 of changing the distance between the wafer W and the light irradiating unit 40 whenever the wafer W is turned one round is added instead. The processes S61 to S66 and the process S68 are the same as the processes S52 to S58 of FIG. 13, respectively. The control unit 100 performs the process S67 between the process S65 of stopping the rotation of the wafer W and the process S68 of starting the rotation of the wafer W in the reverse direction. In the process S67, the distance change control unit 113 controls the distance changing unit 70 to change the distance between the wafer W and the light irradiating unit 40 based on the control target value stored in the recipe storage unit 117 (see FIG. 15A and FIG. 15B). The control target value is previously set to change the distance between the wafer W and the light irradiating unit 40 within the range including the first distance and the second distance. Further, the process S67 of changing the distance can be combined with any sequence described in the third modification example.

<Effects of the Exemplary Embodiment>

As stated above, the substrate processing apparatus 1 includes the rotating/holding unit 30 configured to hold and rotate the wafer W having the organic film on the front surface Wa thereof; the light irradiating unit 40 configured to irradiate the light for ashing of the organic film to the front surface Wa of the wafer W held by the rotating/holding unit 30; the gas flow forming unit 50 configured to form the gas flow of the oxygen-containing gas to allow the gas to pass through the space between the wafer W held by the rotating/holding unit 30 and the light irradiating unit 40; the irradiation control unit 114 configured to control the light irradiating unit 40 to irradiate the light for ashing to the front surface Wa of the wafer W in the state that the gas flow of the oxygen-containing gas is formed between the wafer W and the light irradiating unit 40 by the gas flow forming unit 50; and the rotation control unit 115 configured to control the rotating/holding unit 30 to rotate the wafer W in the state that the gas flow of the oxygen-containing gas is formed between the wafer W and the light irradiating unit 40 by the gas flow forming unit 50 and the light for ashing is irradiated to the front surface Wa of the wafer W by the light irradiating unit 40.

According to this substrate processing apparatus 1, the light for ashing is irradiated to the front surface Wa of the wafer W in the state that the gas flow of the oxygen-containing gas is formed between the wafer W and the light irradiating unit 40 by the gas flow forming unit 50. Therefore, since the oxygen is continuously supplied into the space between the wafer W and the light irradiating unit 40 while the light for ashing is being irradiated, the ashing can be easily performed to a required level. Further, the wafer W is rotated in the state that the gas flow of the oxygen-containing gas is formed between the wafer W and the light irradiating unit 40 by the gas flow forming unit 50 and the light for ashing is irradiated to the front surface Wa of the wafer W by the light irradiating unit 40. Accordingly, the non-uniformity in the ashing that might be caused by the gas flow can be suppressed. Thus, the uniformity of the ashing can be improved.

The substrate processing apparatus 1 may be further equipped with the heat plate 33 provided in the rotating/holding unit 30 to face the rear surface Wb of the wafer W and configured to be rotated along with the wafer W; and the heating control unit 111 configured to control the heat plate 33 to adjust the temperature distribution under the condition that the difference in the progression of the ashing in the regions arranged in the diametrical direction of the wafer W is reduced. If there is adopted the configuration in which the wafer W is rotated in the state that the gas flow of the oxygen-containing gas is formed between the wafer W and the light irradiating unit 40 by the gas flow forming unit 50 and the light for ashing is irradiated to the front surface Wa of the wafer W by the light irradiating unit 40, the uniformity of the ashing in the circumferential direction of the wafer W can be improved. In addition, by adopting the configuration in which the temperature distribution is adjusted in each of the regions arranged in the diametrical direction of the wafer W, the uniformity of the ashing in the diametrical direction of the wafer W can also be improved.

The irradiation control unit 114 may control the light irradiating unit 40 to adjust the irradiation amount of the light for ashing under the condition that the difference in the progression of the ashing in the regions arranged in the diametrical direction of the wafer W is reduced. In this case, by adopting the configuration in which the irradiation amount of the light for ashing is adjusted for each of the regions arranged in the diametrical direction of the wafer W, the uniformity of the ashing in the diametrical direction of the wafer W can be improved.

The substrate processing apparatus 1 may be further equipped with the distance changing unit 70 configured to change the distance between the wafer W held by the rotating/holding unit 30 and the light irradiating unit 40; and the distance change control unit 113 configured to control the distance changing unit 70 to change the distance between the wafer W and the light irradiating unit 40 such that, in the state that the gas flow of the oxygen-containing gas is formed between the wafer W and the light irradiating unit 40, the light for ashing is irradiated under the multiple conditions where the distances between the wafer W and the light irradiating unit 40 are set to be different. In this case, by changing the distance between the wafer W and the light irradiating unit 40, a distribution of an oxygen concentration can be changed in a gas flow direction, so that the uniformity of the ashing in the gas flow direction can be improved.

The substrate processing apparatus 1 may be further equipped with the oxygen adding unit 80 configured to add the oxygen to the oxygen-containing gas; and the addition control unit 116 configured to control the oxygen adding unit 80 to add the oxygen to the oxygen-containing gas before being introduced into the space between the wafer W and the light irradiating unit 40 in the state that the gas flow of the oxygen-containing gas is formed between the wafer W and the light irradiating unit 40 by the gas flow forming unit 50 and the light for ashing is irradiated to the front surface Wa of the wafer W by the light irradiating unit 40. In this case, by adding the oxygen, lack of the oxygen at the downstream side of the gas flow can be suppressed, so that the uniformity of the ashing in the gas flow direction can be improved. Therefore, in a case that the ashing rate at the central portion of the wafer W becomes smaller than the ashing rate at the edge portion thereof, the difference between the ashing rates can be reduced by adding the oxygen.

The oxygen adding unit 80 is equipped with the supply port through which the gas for adding the oxygen is supplied, and the supply port may be opened toward the center of the space between the wafer W and the light irradiating unit 40. In this case, the addition of the oxygen to the downstream side of the gas flow is accelerated by a flow velocity of the gas for adding the oxygen when the gas is supplied.

The light irradiating unit 40 may be configured to irradiate the light for ashing to the oxygen-containing gas before being introduced into the space between the wafer W and the light irradiating unit 40 in the state that the gas flow of the oxygen-containing gas is formed between the wafer W and the light irradiating unit 40 by the gas flow forming unit 50. In this case, by activating the oxygen before the oxygen-containing gas is introduced into the space between the wafer W and the light irradiating unit 40, the lack of active oxygen immediately after the introduction of the oxygen-containing gas can be suppressed, so that the uniformity of the ashing in the gas flow direction can be bettered.

The rotation control unit 115 may control the rotating/holding unit 30 to decrease the rotation speed of the wafer W with a lapse of time from the beginning of the irradiation of the light for ashing to the wafer W. The progression speed of the ashing under the same condition (hereinafter, simply referred to as "ashing rate") tends to decrease with a lapse of time. If the ashing rate is decreased while the wafer W is being rotated, the effect of improving the uniformity through the rotation of the wafer W is weakened. As a resolution, by decreasing the rotation speed of the wafer W with the lapse of time from the beginning of the irradiation of the light for ashing to the wafer W, the influence caused by the decrease of the ashing rate can be suppressed, so that the weakening of the effect of improving the uniformity can be suppressed.

The irradiation control unit 114 may control the light irradiating unit 40 to increase the irradiation amount of the light for ashing with the lapse of time from the beginning of the irradiation of the light for ashing to the wafer W. In this case, by increasing the irradiation amount of the light for ashing with the lapse of time from the beginning of the irradiation of the light for ashing to the wafer W, the influence caused by the decrease of the ashing rate is suppressed, so that it is possible to reduce the deterioration of the effect of improving the uniformity.

The rotation control unit 115 may control the rotating/holding unit 30 to rotate the wafer W two rounds or more in the state that the gas flow of the oxygen-containing gas is formed between the wafer W and the light irradiating unit 40 by the gas flow forming unit 50 and the light for ashing is irradiated to the front surface Wa of the wafer W by the light irradiating unit 40. In this case, the decrease of the ashing rate when the wafer W is rotated one round is reduced. Therefore, the weakening of the effect of improving the uniformity can be suppressed.

So far, the exemplary embodiments have been described. However, it should be noted that the exemplary embodiments are not limiting and various changes and modifications may be made. By way of example, the substrate as the processing target in the substrate processing apparatus 1 may not be limited to the semiconductor wafer and may be, by way of example, a glass substrate, a mask substrate, a FPD (Flat Panel Display), or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A substrate processing apparatus, comprising:
a rotating/holding unit configured to hold and rotate a substrate having an organic film on a front surface thereof;
a light irradiating unit configured to irradiate light to the front surface of the substrate held by the rotating/holding unit;
a gas flow forming unit configured to form a gas flow of a gas to allow the gas to pass through a space between the substrate held by the rotating/holding unit and the light irradiating unit;
a case configured to accommodate the rotating/holding unit, wherein the rotating/holding unit is provided under the light irradiating unit and a formation of the gas flow of the gas and an irradiation of the light are simultaneously performed within the case;
an irradiation control unit configured to control the light irradiating unit to irradiate the light to the front surface of the substrate in a state that the gas flow of the gas is formed between the substrate and the light irradiating unit by the gas flow forming unit; and
a rotation control unit configured to control the rotating/holding unit to rotate the substrate while the gas flow of the gas is being formed between the substrate and the light irradiating unit by the gas flow forming unit and the light is being irradiated to the front surface of the substrate by the light irradiating unit.

2. A substrate processing method, comprising:
forming a gas flow of a gas by a gas flow forming unit to allow the gas to pass through a space between a substrate, held by a rotating/holding unit, having an organic film on a front surface thereof and a light irradiating unit configured to irradiate light; and
irradiating the light to the front surface of the substrate from the light irradiating unit and rotating the substrate by the rotating/holding unit in a state that the gas flow of the gas is formed between the substrate and the light irradiating unit, the light irradiating unit being controlled by an irradiation control unit and the rotating/holding unit being controlled by a rotation control unit,
wherein the forming of the gas flow and the irradiating of the light are simultaneously performed within a same case accommodating the rotating/holding unit, and
the rotating/holding unit is provided under the light irradiating unit.

3. The substrate processing apparatus of claim 1, further comprising:
a distance changing unit configured to move up and down the substrate held by the rotating/holding unit and change a distance between the substrate and the light irradiating unit,
wherein the rotating/holding unit comprises a heat plate facing a rear surface of the substrate, and
the distance changing unit is configured to change the distance such that the heat plate moves along the substrate.

* * * * *